(12) United States Patent
Li et al.

(10) Patent No.: US 9,244,685 B2
(45) Date of Patent: *Jan. 26, 2016

(54) SYSTEM AND METHOD FOR CHECK-NODE UNIT MESSAGE PROCESSING

(71) Applicant: LSI Corporation, Milpitas, IA (US)

(72) Inventors: Zongwang Li, Dublin, CA (US);
Chung-Li Wang, San Jose, CA (US);
Kaitlyn T. Nguyen, San Jose, CA (US);
Keklik Bayam Alptekin, Mountain View, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 678 days.

This patent is subject to a terminal disclaimer.

(21) Appl. No.: 13/667,450

(22) Filed: Nov. 2, 2012

(65) Prior Publication Data
US 2014/0130061 A1    May 8, 2014

(51) Int. Cl.
*H03M 13/00*      (2006.01)
*G06F 9/30*      (2006.01)

(52) U.S. Cl.
CPC .................................. *G06F 9/30145* (2013.01)

(58) Field of Classification Search
CPC ........................ H03M 13/1131; G06F 9/30145
See application file for complete search history.

(56) References Cited

U.S. PATENT DOCUMENTS

| | | | | |
|---|---|---|---|---|
| 6,986,096 B2 * | 1/2006 | Chaudhuri et al. | ........... | 714/780 |
| 7,716,553 B2 | 5/2010 | Kim et al. | | |
| 8,122,315 B2 | 2/2012 | Choi et al. | | |
| 8,996,969 B2 * | 3/2015 | Bolotov et al. | ............... | 714/785 |
| 2005/0149840 A1 * | 7/2005 | Lee et al. | ...................... | 714/800 |
| 2009/0158121 A1 * | 6/2009 | Oh et al. | ...................... | 714/759 |
| 2010/0153819 A1 * | 6/2010 | Ueng et al. | .................... | 714/763 |
| 2011/0010602 A1 * | 1/2011 | Chung et al. | .................. | 714/752 |

* cited by examiner

*Primary Examiner* — M. Mujtaba K Chaudry (57) ABSTRACT

The disclosure is directed to a system and method for storing and processing check-node unit (CNU) messages utilizing random access memory (RAM). A decoder includes a layered array of CNUs configured to receive at least one variable-node unit (VNU) message associated with decoded bits of at least one data segment being operated upon by the decoder. The decoder further includes a CNU message converter configured to permutate at least one initial circulant of the VNU message to generate a converted CNU message having sub-circulants sized for RAM-based processing. The decoder further includes RAM configured to store sub-circulants of the converted CNU message at addressable memory blocks for parallel VNU processing.

20 Claims, 6 Drawing Sheets

$$300 \diagdown H = \begin{bmatrix} P_{1,1} & 0 & \cdots & 0 & \cdots & P_{1,n} \\ 0 & P_{1,2} & \cdots & 0 & \cdots & 0 \\ \vdots & \vdots & \ddots & \vdots & \ddots & \vdots \\ 0 & P_{c_j,2} & \cdots & P_{c_j-1,j} & \cdots & 0 \\ P_{c_j,1} & 0 & \cdots & P_{c_j,j} & \cdots & P_{c_j,n} \end{bmatrix}$$

$$302 \diagdown P_{i,j} = \begin{bmatrix} 0 & \alpha & 0 & \cdots & 0 \\ 0 & 0 & \alpha & \cdots & 0 \\ \vdots & \vdots & \vdots & & \vdots \\ 0 & 0 & 0 & \cdots & \alpha \\ \alpha & 0 & 0 & \cdots & 0 \end{bmatrix}$$

SYSTEM AND METHOD FOR CHECK-NODE UNIT MESSAGE PROCESSING

BACKGROUND

Storage systems often employ decoders, such as, but not limited to LDPC decoders, to maintain data integrity by operating on codewords formed by one or more bits of at least one data segment. Some decoders include one or more check node units (CNUs) configured to receive variable node unit (VNU) messages associated with decoded bits. The VNU message is processed by the CNUs and converted into a CNU message for further processing by one or more VNUs. The amount of circuitry utilized is generally proportional to performance of a CNU message processing circuit. In some embodiments, a CNU message is stored in a plurality of flip-flop registers to achieve high processing bandwidth. Large multiplexer and de-multiplexer units are typically required to access the plurality of flip-flop registers.

SUMMARY

An embodiment of the disclosure is a system for check-node unit (CNU) message processing including a CNU message converter and random access memory (RAM). The CNU message converter is configured to receive at least one initial circulant of at least one initial Variable Node Unit (VNU) message. The CNU message converter is further configured to permutate the at least one initial circulant to yield at least one divisible circulant having a selected number of sub-circulants of the initial VNU messages in CNU processing order. The CNU message converter generates at least one converted CNU message utilizing the divisible circulant. RAM is configured to receive and store the at least one converted CNU message for further processing.

It is to be understood that both the foregoing general description and the following detailed description are not necessarily restrictive of the disclosure. The accompanying drawings, which are incorporated in and constitute a part of the specification, illustrate embodiments of the disclosure.

BRIEF DESCRIPTION OF THE DRAWINGS

The embodiments of the disclosure may be better understood by those skilled in the art by reference to the accompanying figures in which.

DETAILED DESCRIPTION

Reference will now be made in detail to the embodiments disclosed, which are illustrated in the accompanying drawings.

Figure 1:
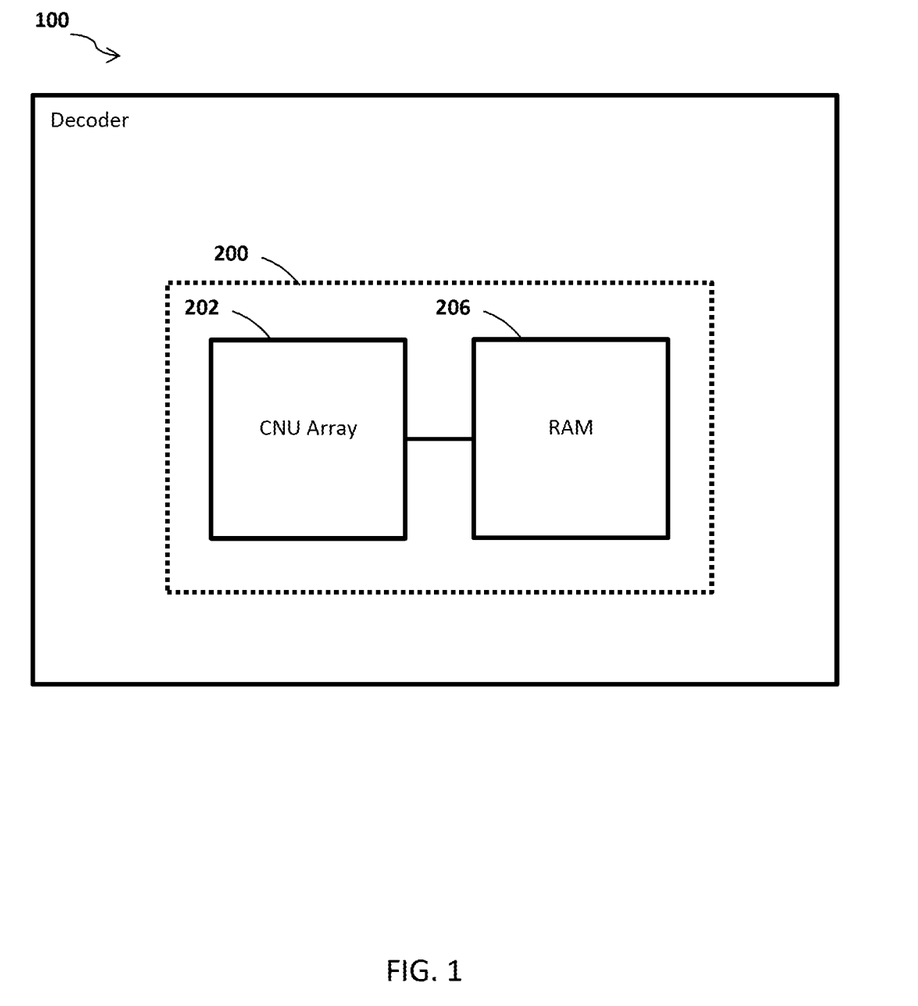
FIG. 1 is a block diagram illustrating a decoder including a system for check-node unit (CNU) message processing, in accordance with an embodiment of the present invention.

FIGS. 1 through 6 generally illustrate a system and method for processing check-node unit (CNU) messages utilizing random access memory (RAM). FIG. 1 illustrates an embodiment of a decoder 100 configured for decoding one or more bits of at least one data segment to maintain data integrity of the data segment. In some embodiments, the decoder 100 includes, but is not limited to, a layered LDPC decoder. The decoder 100 includes a CNU message processing system 200 configured for RAM-based CNU message processing. The CNU message processing system 200 includes a CNU array 202 configured for receiving at least one variable node unit (VNU) message. In some embodiments, the CNU array 202 includes a plurality of layered CNUs for improved system throughput.

Figure 2:
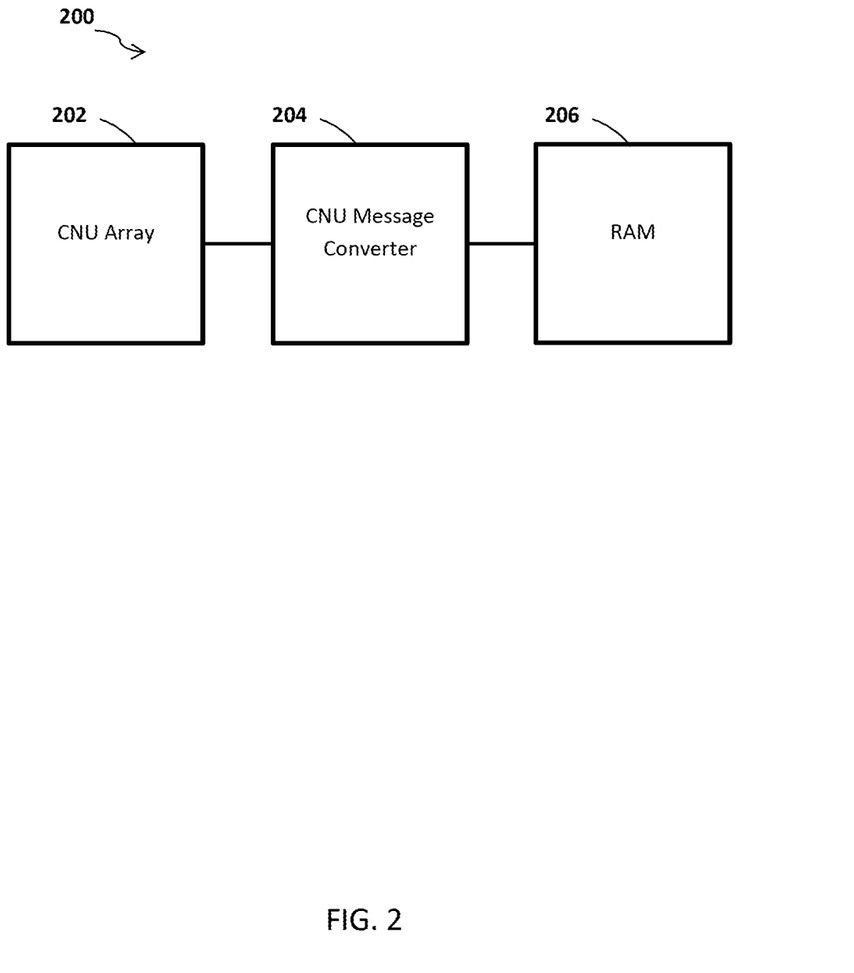
FIG. 2 is a block diagram illustrating the system for CNU message processing, in accordance with an embodiment of the present invention.
Figure 3:
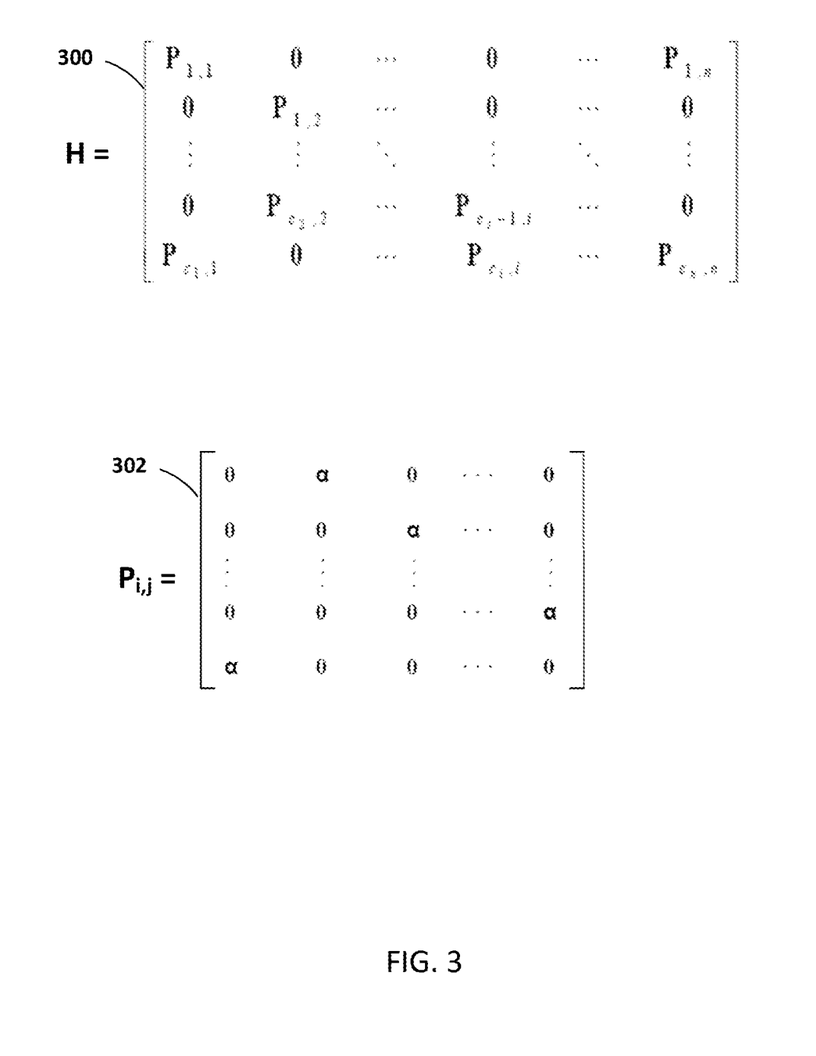
FIG. 3 is a block diagram illustrating a parity check matrix (H matrix) and at least one circulant of the H matrix, in accordance with an embodiment of the present invention.

One or more RAM units 206 are configured to store messages received from the CNU array 202 for further processing. RAM 206 includes addressable memory blocks allowing for address-based access without need for complex multiplexers and de-multiplexers. As illustrated in FIG. 2, the CNU message processing system 200 further includes a CNU message converter 204 configured to modify an initial VNU message to yield a converted CNU message that is computationally improved for RAM-based processing. For example, FIG. 3 illustrates a parity check matrix (H matrix) 300 of a codeword associated with the initial VNU message, wherein the H matrix 300 includes at least one initial circulant 302 having an initial circulant size. In some instances, the initial circulant 302 not sized for RAM-based processing. The CNU message converter 204 is configured to permutate the initial circulant 302 to yield a divisible circulant including sub-circulants of the initial VNU message in CNU processing order. The sub-circulants are sized for RAM-based processing. RAM 206 is configured to store the sub-circulants of the divisible circulant of the converted CNU message for further processing by VNUs in communication with RAM 206.

In an embodiment, the CNU message converter 204 includes electronic circuitry configured to permutate the initial circulant 302 of the initial CNU message in accordance with a permutation algorithm, such as, but not limited to, a row and column permutation algorithm described herein. In another embodiment, the CNU message converter 204 includes any combination of hardware, software, or firmware, such as a processor configured for executing program instructions from carrier media. In some embodiments at least one of the CNU array 202 or RAM 206 include at least a portion of the CNU message converter 204 circuitry, hardware, software, or firmware. In some embodiments, the CNU message converter 204 further includes means for converting codewords to hardware flexible formats described in U.S. patent application Ser. No. 13/474,664, incorporated herein by reference.

The CNU message converter 204 operates on the initial circulant 302 to perform a row permutation or a column permutation to rearrange rows or columns of the initial circulant in accordance with the following equation:

Permutation Index$(i)$=mod$(i,s)*(p/s)$+floor$(i/s)$, for $i$=0 to $p$−1

In the Permutation Index equation above, variable "p" is associated with the circulant size of the initial circulant 302, such that the initial circulant 302 includes a matrix with p rows and p columns. Variable "i" is associated with the row or column index of the initial circulant 302, such that the Permutation Index(i) result corresponds to a new row or column position after a permutation is performed for a row or column with an initial index i. Variable "s" is a selected number of sub-circulants in the divisible circulant generated by permutation of the initial circulant 302, wherein the sub-circulants of the divisible circulant have sub-circulant size (p/s). In some embodiments, variable "s" of the permutation equation is selected in response to the selected sub-circulant size (p/s).

In an embodiment, the CNU message converter 204 is configured to perform a row permutation to rearrange rows of the initial circulant 302 to yield an intermediate circulant. The CNU message converter 204 is further configured to perform a column permutation to rearrange columns of the intermediate circulant to yield the divisible circulant. In another embodiment, the CNU message converter 204 is configured to perform a column permutation on the initial circulant 302 to yield the intermediate circulant. The CNU message converter 204 is further configured to perform a row permutation on the intermediate circulant to yield the divisible circulant. It is further contemplated that the CNU message converter 204 may be configured to execute any number of steps in any order to rearrange elements of the initial circulant 302 to yield a divisible circulant including sub-circulants having a selected size for RAM-based processing. In some embodiments, the CNU message converter 204 is further configured to perform one or more steps of the methods that follow.

Figure 4:
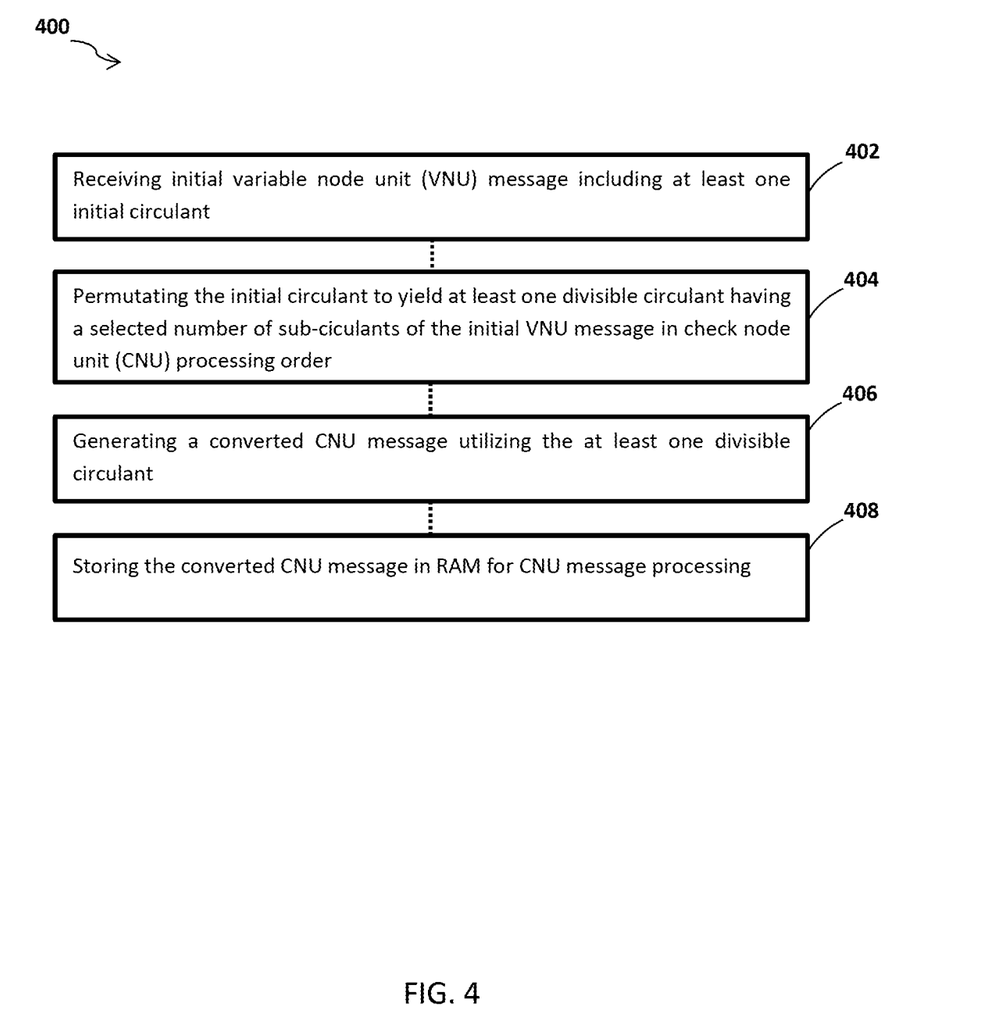
FIG. 4 is a flow diagram illustrating a method of CNU message processing, in accordance with an embodiment of the present invention.

FIG. 4 illustrates an embodiment of a method 400 of converting the initial VNU message into a converted CNU message including a divisible circulant with sub-circulants sized for RAM-based storage and processing. At step 402, an initial VNU message is received by the CNU array 202. The VNU message includes at least one initial circulant having size p (i.e. p×p matrix). At step 404, the initial circulant is permutated by the CNU message converter 204 to yield at least one divisible circulant including a selected number of sub-circulants of the initial VNU message in CNU processing order. The sub-circulants have a selected size for processing and storage utilizing RAM 206. At step 406, the CNU message converter 204 forms a converted CNU message utilizing the divisible circulant. The converted CNU message includes sub-circulants of the initial VNU message with selected size for RAM-based processing. At step 408, the converted CNU message is stored in RAM 206 for further VNU processing. In an embodiment, sub-circulants of the converted CNU message are stored at addressable memory blocks within RAM 206 for retrieval utilizing RAM-addressing.

In an embodiment, step 404 of permutating at least one initial circulant of the initial CNU message includes permutating rows and columns of the initial circulant in accordance with the previously described Permutation Index equation:

$$\text{Permutation Index}(i) = \text{mod}(i,s)*(p/s) + \text{floor}(i/s), \text{ for } i=0 \text{ to } p-1$$

Figure 5:
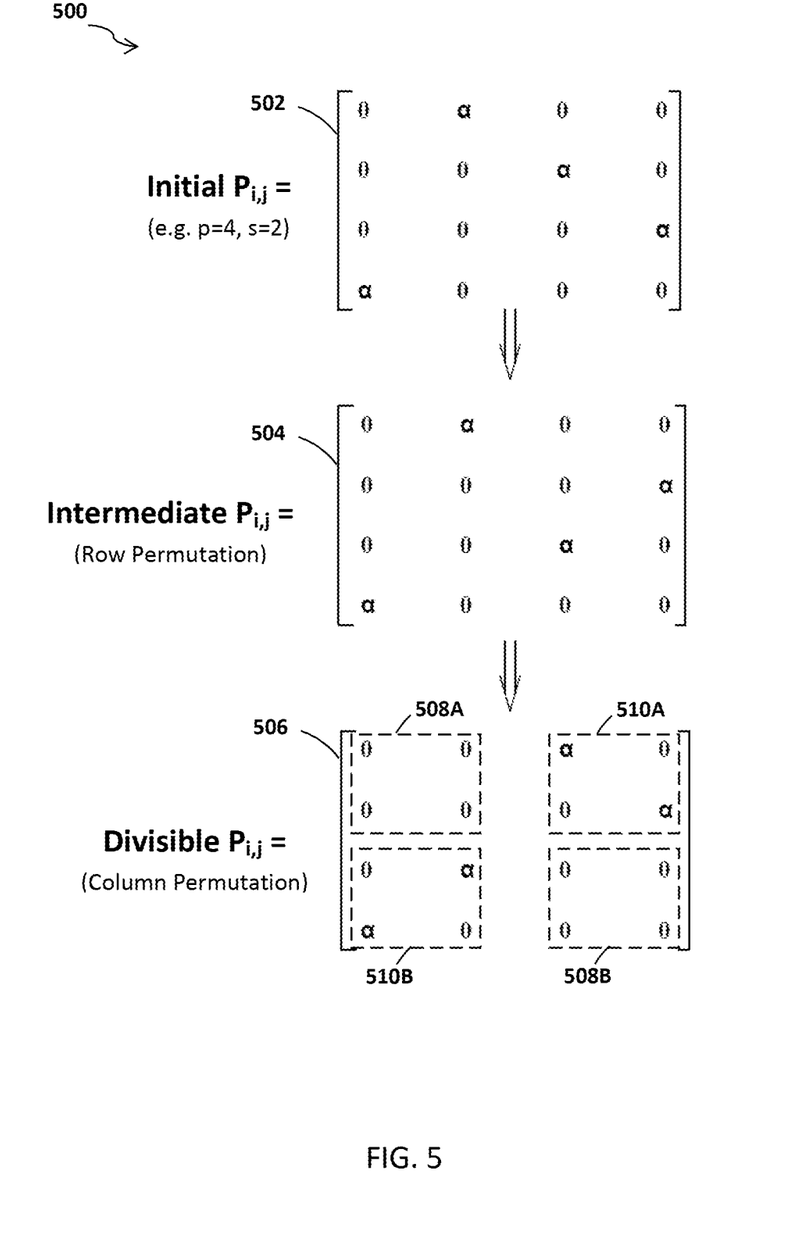
FIG. 5 is a flow diagram illustrating a sample permutation of an initial circulant to yield a divisible circulant, wherein the initial circulant undergoes a row permutation followed by a column permutation, in accordance with an embodiment of the present invention.

FIG. 5 illustrates a sample permutation 500 of an initial circulant 502 having an initial circulant size size (p=4). Sample permutation 500 illustrates an embodiment of a multiple step permutation including a row permutation of the initial circulant 502 to yield an intermediate circulant 504 and a column permutation of the intermediate circulant 504 to yield a divisible circulant 506 including two sub-circulants 510A, 510B and two zero elements 508A, 508B.

In the sample permutation 500 a row permutation is performed on the initial circulant 502 in accordance with the Permutation Index equation, such that destination indices for the rows having initial indices (i=0 to 3) are determined as follows:

$$\text{Permutation Index}(0) = \text{mod}(0,2)*(4/2) + \text{floor}(0/2) = 0*2 + 0 = 0;$$

$$\text{Permutation Index}(1) = \text{mod}(1,2)*(4/2) + \text{floor}(1/2) = 1*2 + 0 = 2;$$

$$\text{Permutation Index}(2) = \text{mod}(2,2)*(4/2) + \text{floor}(2/2) = 0*2 + 1 = 1;$$

and $$\text{Permutation Index}(3) = \text{mod}(3,2)*(4/2) + \text{floor}(3/2) = 1*2 + 1 = 3.$$

The initial circulant 502 undergoes a first permutation, the row permutation, where row 0 of the initial circulant 502 becomes row 0 of the intermediate circulant 504; row 1 of the initial circulant 502 becomes row 2 of the intermediate circulant 504; row 2 of the initial circulant 502 becomes row 1 of the intermediate circulant 504; and row 3 of the initial circulant 502 becomes row 3 of the intermediate circulant 504.

Sample permutation 500 further illustrates a second permutation, the column permutation, performed on the intermediate circulant 504 in accordance with the Permutation Index equation to yield the divisible circulant 506. Since the column permutation is performed utilizing similar parameters, the destination indices for columns of the intermediate circulant 504 mirror those determined for performing the row permutation on the initial circulant 502. After the intermediate circulant 504 undergoes the column permutation, column 0 of the intermediate circulant 504 becomes column 0 of the divisible circulant 506; column 1 of the intermediate circulant 504 becomes column 2 of the divisible circulant 506; column 2 of the intermediate circulant 504 becomes column 1 of the divisible circulant 506; and column 3 of the intermediate circulant 504 becomes column 3 of the divisible circulant 506.

As shown in FIG. 5, the divisible circulant 506 resulting from permutation 500 of the initial circulant 502 includes the selected number of (s=2) sub-circulants 510A and 510B having a selected size (p/s=2). The divisible circulant further includes zero elements 508A and 508B. The sub-circulants 510 are stored in RAM 206 for VNU processing. It is noted herein that the foregoing example of sample permutation 500 is illustrates an embodiment of the disclosure and is not intended to be limiting. It is contemplated that any system or method of modifying an initial circulant to achieve a selected circulant size for RAM-based processing is equally applicable. Those skilled in the art will understand the modifiable nature of the systems and methods disclosed herein. The embodiment that follows further illustrates the modifiable nature of the systems and methods described herein.

Figure 6:
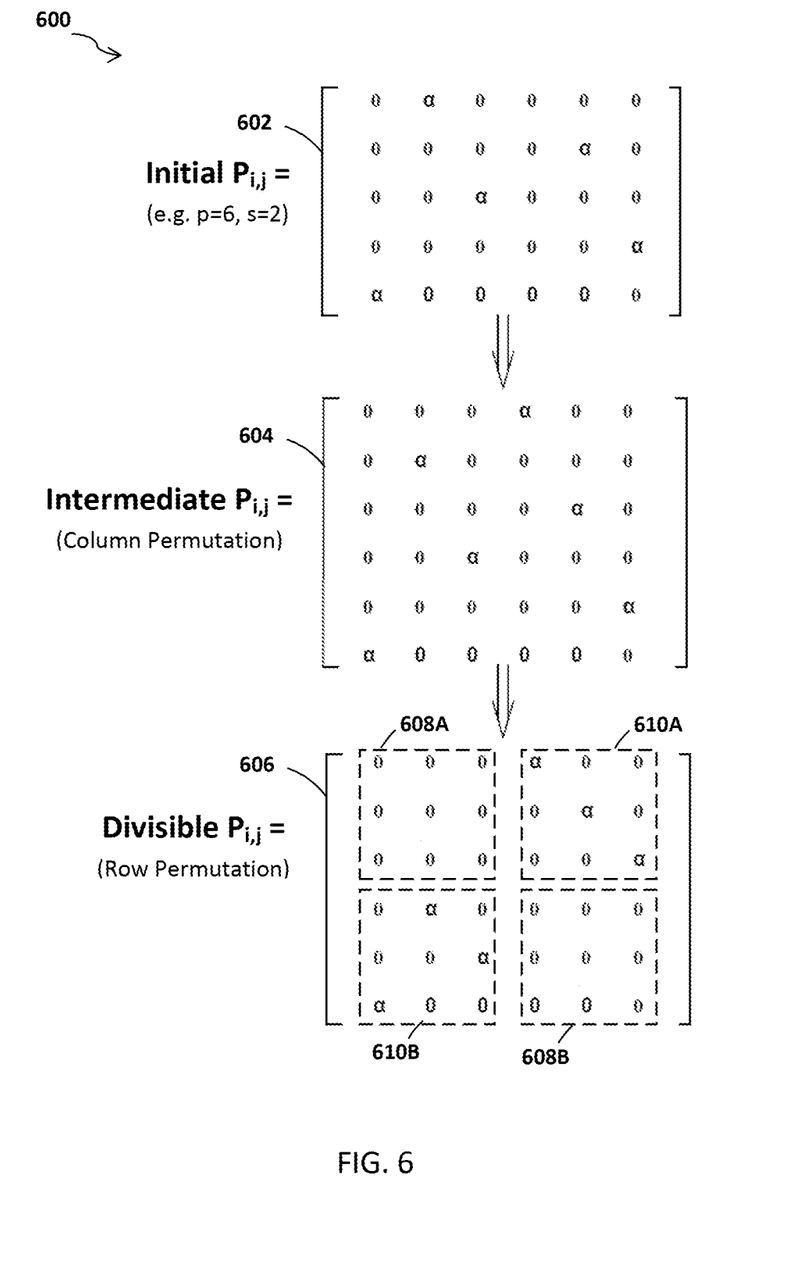
FIG. 6 is a flow diagram illustrating a sample permutation of an initial circulant to yield a divisible circulant, wherein the initial circulant undergoes a column permutation followed by a row permutation, in accordance with an embodiment of the present invention.

FIG. 6 illustrates another sample permutation 600 in accordance with step 404 of method 400, wherein a column permutation is performed on an initial circulant 602 to yield an intermediate circulant 604. Further, a row permutation is performed on the intermediate circulant 604 to yield the divisible circulant 606 including a selected number (s=2) of sub-circulants having a selected size (p/s=3). Permutation indices are determined in accordance with the Permutation Index equation, such that destination indices for the columns or rows having initial indices (i=0 to 6) are determined as follows:

Permutation Index(0)=mod(0,2)*(6/2)+
floor(0/2)=0*2+0=0;

Permutation Index(1)=mod(1,2)*(6/2)+
floor(1/2)=1*3+0=3;

Permutation Index(2)=mod(2,2)*(6/2)+
floor(2/2)=0*3+1=1;

Permutation Index(3)=mod(3,2)*(6/2)+
floor(3/2)=1*3+1=4;

Permutation Index(4)=mod(4,2)*(6/2)+
floor(4/2)=0*3+2=2;

and

Permutation Index(5)=mod(5,2)*(6/2)+
floor(5/2)=1*3+3=5.

In sample permutation 600 the initial circulant 602 undergoes a first permutation, the column permutation, where column 0 of the initial circulant 602 becomes column 0 of the intermediate circulant 604; column 1 of the initial circulant 602 becomes column 3 of the intermediate circulant 604; column 2 of the initial circulant 602 becomes column 1 of the intermediate circulant 604; column 3 of the initial circulant 602 becomes column 4 of the intermediate circulant 604; column 4 of the initial circulant 602 becomes column 2 of the intermediate circulant 604; and column 5 of the initial circulant 602 becomes column 5 of the intermediate circulant 604.

The intermediate circulant 604 undergoes a second permutation, the row permutation, where row 0 of the intermediate circulant 604 becomes row 0 of the divisible circulant 606; row 1 of the intermediate circulant 604 becomes row 3 of the divisible circulant 606; row 2 of the intermediate circulant 604 becomes row 1 of the divisible circulant 606; row 3 of the intermediate circulant 604 becomes row 4 of the divisible circulant 606; row 4 of the intermediate circulant 604 becomes row 2 of the divisible circulant 606; and row 5 of the intermediate circulant 604 becomes row 5 of the divisible circulant 606.

The divisible circulant 606 resulting from sample permutation 600 of the initial circulant 602 includes sub-circulants 610A and 610B and zero elements 608A and 608B. Sample permutations 500 and 600 demonstrate the modifiable nature of the parameters, order, and number of steps in method 400. Similarly, systems 100 and 200 are modifiable in accordance with implementational requirements appreciable by those skilled in the art.

It should be recognized that in some embodiments the various steps described throughout the present disclosure may be carried out by a single computing system or multiple computing systems. A computing system may include, but is not limited to, a personal computing system, mainframe computing system, workstation, image computer, parallel processor, or any other device known in the art. In general, the term "computing system" is broadly defined to encompass any device having one or more processors, which execute instructions from a memory medium.

Program instructions implementing methods, such as those manifested by embodiments described herein, may be transmitted over or stored on carrier medium. The carrier medium may be a transmission medium, such as, but not limited to, a wire, cable, or wireless transmission link. The carrier medium may also include a storage medium such as, but not limited to, a read-only memory, a random access memory, a magnetic or optical disk, or a magnetic tape.

Embodiments manifesting methods described herein may include storing results in a storage medium. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that any embodiment of the disclosure manifested above as a system or method may include at least a portion of any other embodiment described herein. Those having skill in the art will appreciate that there are various embodiments by which systems and methods described herein can be effected, and that the implementation will vary with the context in which an embodiment of the disclosure deployed.

Furthermore, it is to be understood that the invention is defined by the appended claims. Although embodiments of this invention have been illustrated, it is apparent that various modifications may be made by those skilled in the art without departing from the scope and spirit of the foregoing disclosure.

What is claimed is:

1. A system for check-node unit (CNU) message processing, comprising:
  a CNU message converter configured to:
    receive at least one initial circulant of at least one initial VNU message;
    permutate the at least one initial circulant to yield at least one divisible circulant having a selected number of sub-circulants; and
    generate at least one converted CNU message utilizing the at least one divisible circulant; and
  random access memory (RAM) configured for storing the at least one converted CNU message.

2. The system of claim 1, wherein the CNU message converter is further configured to:
  determine permutation indices for permutating the at least one initial circulant based on the selected number of sub-circulants.

3. The system of claim 2, wherein the CNU message converter is further configured to determine permutation indices utilizing the following equation:

$$\text{Permutation Index}(i)=\text{mod}(i,s)*(p/s)+\text{floor}(i/s), \text{ for } i=0 \text{ to } p-1,$$

wherein
  p=size of initial circulant, and
  s=selected number of sub-circulants.

4. The system of claim 2, wherein the CNU message converter is further configured to:
  rearrange rows of the at least one initial circulant utilizing the permutation indices to yield at least one intermediate circulant; and
  rearrange columns of the at least one intermediate circulant utilizing the permutation indices to yield the at least one divisible circulant.

5. The system of claim 2, wherein the CNU message converter is further configured to:
  rearrange columns of the at least one initial circulant utilizing the permutation indices to yield at least one intermediate circulant; and
  rearrange rows of the at least one intermediate circulant utilizing the permutation indices to yield the at least one divisible circulant.

6. The system of claim 1, wherein the selected number of sub-circulants is based on a RAM characteristic.

7. The system of claim 1, wherein the at least one VNU message includes at least one low density parity check (LDPC) codeword.

8. A decoder, comprising:
a check-node unit (CNU) array configured for receiving VNU messages;
a CNU message converter configured to:
receive at least one initial circulant of at least one initial VNU message received by the CNU array;
permutate the at least one initial circulant to yield at least one divisible circulant having a selected number of sub-circulants; and
generate at least one converted CNU message utilizing the at least one divisible circulant; and
random access memory (RAM) configured for storing the at least one converted CNU message.

9. The decoder of claim 8, wherein the CNU message converter is further configured to:
determine permutation indices for permutating the at least one initial circulant based on the selected number of sub-circulants.

10. The decoder of claim 9, wherein the CNU message converter is further configured to determine permutation indices utilizing the following equation:

$$\text{Permutation Index}(i) = \text{mod}(i,s)*(p/s) + \text{floor}(i/s), \text{ for } i=0 \text{ to } p-1,$$

wherein
p=size of initial circulant, and
s=selected number of sub-circulants.

11. The decoder of claim 9, wherein the CNU message converter is further configured to:
rearrange rows of the at least one initial circulant utilizing the permutation indices to yield at least one intermediate circulant; and
rearrange columns of the at least one intermediate circulant utilizing the permutation indices to yield the at least one divisible circulant.

12. The decoder of claim 9, wherein the CNU message converter is further configured to:
rearrange columns of the at least one initial circulant utilizing the permutation indices to yield at least one intermediate circulant; and
rearrange rows of the at least one intermediate circulant utilizing the permutation indices to yield the at least one divisible circulant.

13. The decoder of claim 8, wherein the selected number of sub-circulants is based a RAM characteristic.

14. The decoder of claim 8, wherein the CNU array includes a plurality of layered CNUs.

15. The decoder of claim 8, wherein the decoder comprises a low density parity check (LDPC) decoder.

16. A method of check-node unit (CNU) message processing, comprising:
receiving at least one initial circulant of at least one initial VNU message;
permutating the at least one initial circulant to yield at least one divisible circulant having a selected number of sub-circulants;
generating at least one converted CNU message utilizing the at least one divisible circulant; and
storing the at least one converted CNU message utilizing random access memory (RAM).

17. The method of claim 16, wherein the method further includes:
determining permutation indices for permutating the at least one initial circulant based on the selected number of sub-circulants.

18. The method of claim 16, wherein the permutation indices are determined utilizing the following equation:

$$\text{Permutation Index}(i) = \text{mod}(i,s)*(p/s) + \text{floor}(i/s), \text{ for } i=0 \text{ to } p-1,$$

wherein
p=size of initial circulant, and
s=selected number of sub-circulants.

19. The method of claim 16, wherein the method further includes:
rearranging rows of the at least one initial circulant utilizing the permutation indices to yield at least one intermediate circulant; and
rearranging columns of the at least one intermediate circulant utilizing the permutation indices to yield the at least one divisible circulant.

20. The method of claim 16, wherein the method further includes:
rearranging columns of the at least one initial circulant utilizing the permutation indices to yield at least one intermediate circulant; and
rearranging rows of the at least one intermediate circulant utilizing the permutation indices to yield the at least one divisible circulant.

* * * * *